United States Patent [19]

Soleimani et al.

[11] Patent Number: 5,596,218

[45] Date of Patent: Jan. 21, 1997

[54] HOT CARRIER-HARD GATE OXIDES BY NITROGEN IMPLANTATION BEFORE GATE OXIDATION

[75] Inventors: Hamid R. Soleimani, Westborough; Brian Doyle, Framingham, both of Mass.; Ara Philipossian, Redwood Shores, Calif.

[73] Assignee: Digital Equipment Corporation, Maynard, Mass.

[21] Appl. No.: 138,906

[22] Filed: Oct. 18, 1993

[51] Int. Cl.$^6$ .................................................. H01L 29/76
[52] U.S. Cl. ........................ 257/369; 257/325; 257/411; 257/635; 257/639
[58] Field of Search .............................. 257/411, 66, 325, 257/369, 410, 635, 639, 914

[56] References Cited

U.S. PATENT DOCUMENTS

| | | | |
|---|---|---|---|
| 4,305,086 | 12/1981 | Khajezadeh | 257/325 |
| 4,420,872 | 12/1983 | Solo de Zaldivar | 257/376 |
| 4,774,197 | 9/1988 | Haddad et al. | 257/411 |
| 5,266,816 | 11/1993 | Seto et al. | 257/66 |
| 5,330,920 | 7/1994 | Soleimani et al. | 437/24 |

OTHER PUBLICATIONS

M. J. Kelley, "Surface-sensitive analytical techniques" *Chemtech* (Feb. 1987) pp. 98–105.

S. M. Sze, *Semiconductor Devices Physics and Technology* John Wiley & Sons, New York (1985) p. 413.

Sameer Haddad et al., "Improvement of Thin–Gate Oxide Integrity Using Through–Silicon–Gate Nitrogen Ion Implantation", *IEEE Electron Device Letters*, vol. EDL-8. No. 2, Feb. 1987, pp. 58–60.

Woodward Yang et al., "Optimization of Low–Pressure Nitridation/Reoxidation of $SiO_2$ for Scaled MOS Devices", *IEEE Transactions on Electron Devices*, vol. 35, No. 7, Jul. 1988, pp. 935–944.

H. R. Soleimani et al., "A Study of the Growth Kinetics of $SiO_2$ in $N_2O$", *International Electron Meeting*, Dec. 1992, pp. 629–632.

W. J. M. J. Josquin et al., "The Oxidation Inhibition in Nitrogen–Implanted Silicon", *J. Electrochem Soc.: Solid-State Science and Technology*, Aug. 1982, vol. 129, No. 8, pp. 1803–1811.

W. J. M. J. Josquin, "The Application of Nitrogen Ion Implantation in Silicon Technology", *Nuclear Instruments and Methods*, 209/210, pp. 581–587 (1983).

*Primary Examiner*—J. Carroll
*Attorney, Agent, or Firm*—Denis G. Maloney; Arthur W. Fisher

[57] ABSTRACT

A CMOS device is provided having a high concentration of nitrogen atoms at the $SiO_2/Si$ interface reducing hot carrier effects associated with operating shorter devices at voltage levels typically used with longer devices. In one embodiment, the process for providing the CMOS device resistant to hot carrier effects makes use of a sacrificial oxide layer through which the nitrogen atoms are implanted and is then removed. Following removal of the sacrificial oxide layer, a gate oxide is grown giving a CMOS device having high nitrogen concentration at the $SiO_2/Si$ interface. In an alternate embodiment, nitrogen atoms are implanted through the final gate oxide using an implantation energy which does not damage the oxide layer.

8 Claims, 2 Drawing Sheets

HOT CARRIER-HARD GATE OXIDES BY NITROGEN IMPLANTATION BEFORE GATE OXIDATION

BACKGROUND OF THE INVENTION

This invention relates generally to semiconductors and more particularly to complementary metal-oxide-semiconductor (CMOS) transistors.

As is known in the art, CMOS transistors are include of a pair (one n-type and one p-type) of metal-oxide-semiconductor field effect transistors (MOSFETS). MOSFETS are fabricated by diffusing two, spaced n-type regions (known as the source and the drain) into a p-type substrate or by diffusing two, spaced p-type regions into an n-type substrate, producing an n-channel MOSFET or a p-channel MOSFET respectively. In addition, a metal gate electrode is disposed over the substrate region separating the source and drain and is insulated therefrom by a layer of insulating material such as an oxide which is generally principally comprised of silicon dioxide.

For an n-channel metal-oxide semiconductor (NMOS) device, when a positive voltage is applied to the gate, the field from the gate will draw electrons into the substrate region surrounding the gate causing a channel to be formed between the drain and source. This formed or induced channel allows current to flow between the source and drain electrodes of the transistor. With a gate voltage present, an increase in drain to source voltage will result in an increase in drain current. As the drain to source voltage continues to increase, the electric field produced under the gate increases.

As is also known, it is desirable to provide increasing numbers of transistors on an integrated circuit (IC) chip without increasing the overall size of the IC chip. One technique to increase circuit density is to scale down the size of each individual transistor on a IC chip. While scaling provides smaller devices and which can be more densely packed, there are several problems associated with scaling.

Although the transistors have been reduced in size, the computer systems in which they are employed typically maintain the same supply voltage levels (e.g. 5 volts). If the supply (or drain) voltage remains constant while the size of the transistor decreases, there is an adverse effect on the current supplying capability of the transistors due to a so called "hot carrier" effect.

In particular, when a MOS type transistor is reduced in size, the distance between the two diffused regions becomes smaller. The field produced under the gate is inversely related to the distance between the diffused regions. A reduction in the distance between the diffused regions without a corresponding decrease in the supply voltage will cause a dramatic increase in the size of the field produced under the gate.

Increasing the size of the field causes the electrons and holes flowing beneath the gate to become excited and accelerate or become "hot". The acceleration of carriers due to an increased field is known as the so called "hot carrier" effect. As the field increases in magnitude the hot carrier effect correspondingly increases and carriers can become so excited that they cross over the substrate/oxide interface and become trapped in the barrier oxide near the interface which separates the gate from the underlying substrate. In addition or instead of becoming trapped, the hot carriers can cause damage to the interface in the form of so called "interface states". These trapped carriers or interface states are undesirable because they modify the current carrying capability of the transistors. The presence of this charge in the barrier oxide at the interface tends to repel the normal current flow in a portion of the channel underlying the gate. Therefore current flow is impeded resulting in less drain current and therefore a slower circuit.

It is well know that introducing nitrogen into the barrier oxide results in an increased resistance to hot carriers crossing into the barrier oxide as compared to the standard gate oxides. Gate oxide nitridation has been accomplished using various methods such as nitridation using $NH_3$, $N_2O$ oxidation, and $N_2$ implantation into polysilicon followed by a high temperature anneal. Several problems exist with each of these techniques.

Nitridation in $NH_3$ is a process wherein a pre-existing oxide undergoes a high temperature anneal in an ambient environment of $NH_3$. This method of nitrogen incorporation yields nitrogen concentrations of up to $1 \times 10^{12}/cm^2$ at the substrate/oxide interface. However, this method of nitridation adversely affects the PMOS (p-type MOSFET) transistor performance by introducing a large amount of hydrogen into the gate oxide. Having a large amount of hydrogen in the gate oxide results in negative bias temperature instability (NBTI) and therefore a less reliable transistor.

Oxidation of Si in $N_2O$ is a hydrogen free process wherein the nitridation occurs as the gate oxide is grown. Since the process is hydrogen free, the NBTI problem is eliminated. However, $N_2O$ oxidation results in low nitrogen content, typically in the range of $8 \times 10^{10}/cm^2$ to $2 \times 10^{11}/cm^2$, at the $SiO_2/S_i$ interface compared to the levels achieved using the $NH_3$ process described above.

Nitrogen implantation into polysilicon is a process wherein a high dose (typically greater than $1 \times 10^{16}/cm^2$) of nitrogen is implanted into polysilicon followed by a 1100° C. annealing step. Polysilicon is a polycrystalline solid comprised of many small regions of single-crystal material whereas silicon is a crystalline solid wherein the atoms are arranged in a periodic fashion. However, here again the interfacial nitrogen content at the $SiO_2/Si$ interface is limited by mechanisms of nitrogen diffusion and solubility in the-polysilicon/$SiO_2$/Si multi-layer system with typical concentration levels being approximately $4 \times 10^{11}/cm^2$. Due to the interplay of these mechanisms, the process is extremely difficult to control. Additionally, if a larger amount of nitrogen is required at the interface, the nitrogen dose in polysilicon must be increased which can result in the formation of an insulating layer of $Si_3N_4$ within the poly which is detrimental to transistor operation. Lastly, the high temperature annealing step required to drive the implanted nitrogen to the $SiO_2/Si$ interface is not compatible with CMOS VLSI processing.

SUMMARY OF THE INVENTION

In accordance with the present invention, an article includes a silicon substrate, an oxide layer disposed on a surface of said silicon substrate and consisting essentially of silicon dioxide and nitrogen atoms diffused throughout. The oxide layer is substantially free of a formation of $Si_3N_4$. The silicon substrate and oxide layer have the highest concentration of nitrogen atoms being in a range of at least $5 \times 10^{11}/cm^2$ to $1 \times 10^{12}/cm^2$ which occurs in a region encompassing an interface between said silicon substrate and said oxide layer. With such an arrangement, an article is provided which has a high concentration of nitrogen atoms at the silicon/oxide interface while the oxide layer is substantially free of hydrogen atoms and the article is free of $Si_3N_4$ formations. Using such an article CMOS transistors and other devices can be manufactured which have a greatly reduced susceptibility to hot carrier effects and do not suffer the performance drawbacks of devices having $Si_3N_4$ formations or hydrogen in their oxide layers.

In accordance with a further aspect of the present invention, a method of manufacturing the above mentioned article includes the steps of providing an oxide layer over a silicon substrate and implanting nitrogen atoms through said oxide layer into said silicon substrate. With such a method, CMOS transistors and other devices can be produced which substantially reduces their susceptibility to hot carrier effects without introducing impurities which are detrimental to the operation of the CMOS transistors.

BRIEF DESCRIPTION OF THE DRAWINGS

The above-mentioned and other features of the invention will now become more apparent by reference to the following description taken in connection with the accompanying drawings in which.

DETAILED DESCRIPTION OF THE PREFERRED EMBODIMENT

Figure 1:
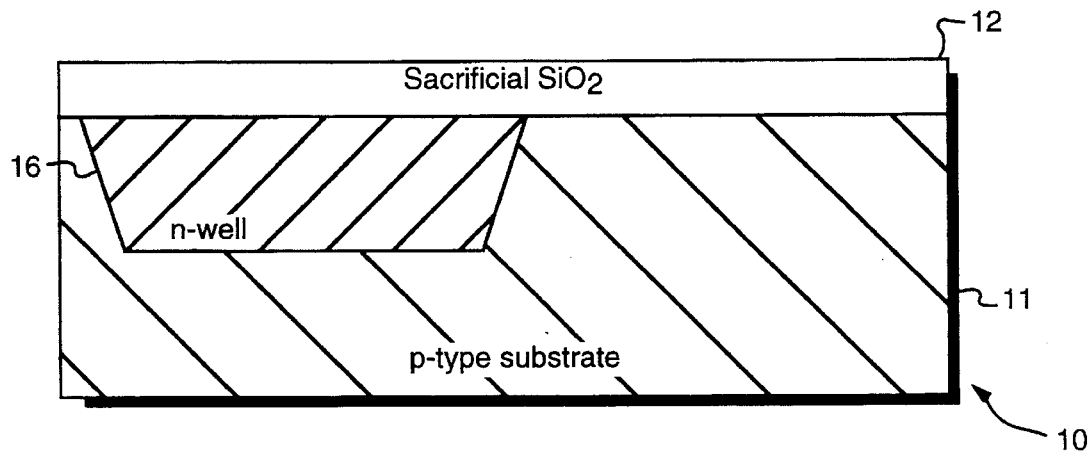
FIGS. 1 through 6 are diagrammatic cross sections of a CMOS device at various stages of manufacture.

Referring now to FIG. 1, a structure 10 is shown at the early stage of a CMOS fabrication process. The structure 10 includes silicon substrate 11 which is a so called "p-type" substrate and is shown to include a so called "n-type well" (n-tub) 16 diffused therein. Also, a sacrificial oxide layer 12 here is thermally grown on a surface of the underlying silicon substrate 11. The sacrificial oxide layer 12 is grown in a conventional manner using an oxygen ambient to provide a layer of silicon dioxide ($SiO_2$) which is typically 450 angstroms thick.

Figure 2:
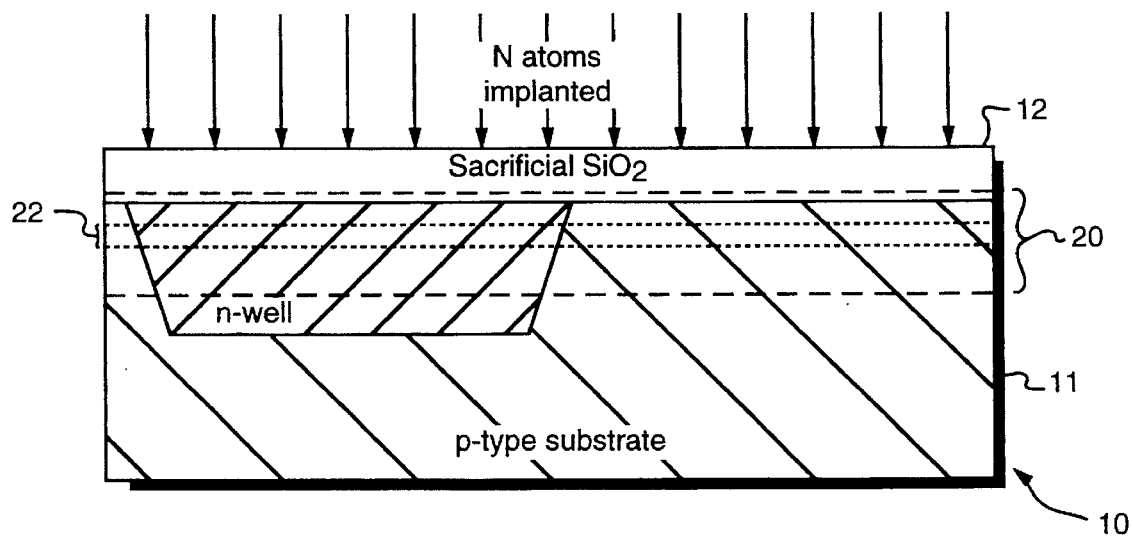

Referring now to FIG. 2, the structure 10 with oxide layer 12 is shown to be undergoing a process of nitrogen implantation. Using conventional ion implantation techniques, nitrogen is implanted through the oxide layer 12 and into the underlying substrate 11. Typical implantation parameters include an $N_2$ concentration of $8 \times 10^{14}/cm^2$ implanted using an energy of 80 keV. The resultant structure 10 after implantation has a region 20 having a concentration of nitrogen atoms incorporated throughout. Region 20 extends into the oxide layer 12 as well as the underlying substrate 10. At this stage, the highest concentration of nitrogen atoms is in region 22 of the silicon substrate 10 generally below the substrate/oxide interface 24.

Figure 3:
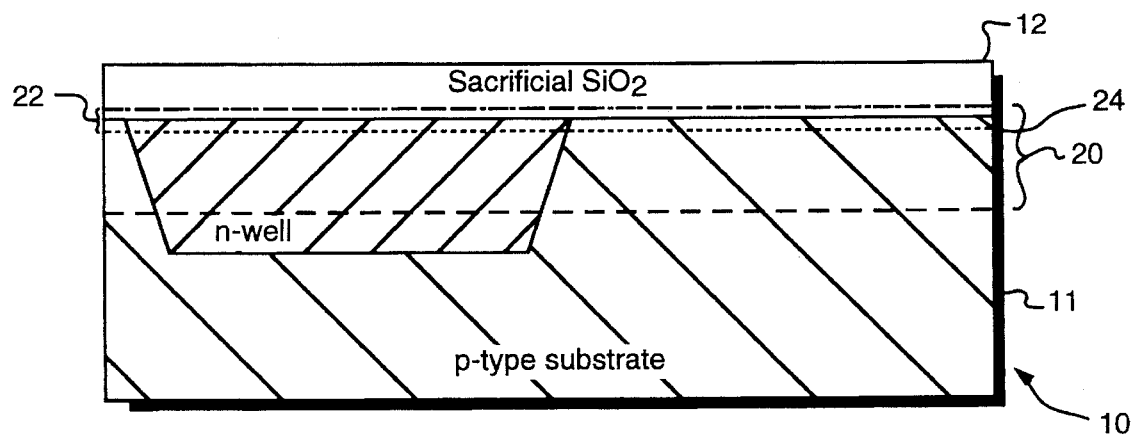

Referring now to FIG. 3, the nitrogen implanted structure 10 is shown having undergone an annealing process. During the annealing process the structure 10 is placed in an annealing chamber (not shown) which is filled with nitrogen gas and heated to a temperature of approximately 950° C. for a period of ten to twenty minutes. Subjecting the nitrogen implanted structure 10 to the aforementioned annealing process causes the nitrogen atoms to "pile up" at the interface 24 resulting in a region of highest concentration 22 of nitrogen atoms which generally surrounds the substrate/oxide interface 12 as shown.

Figure 4:
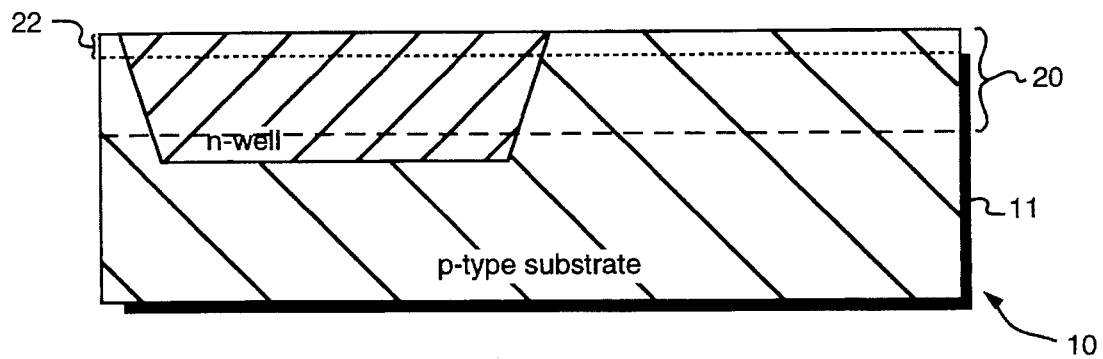

Referring now to FIG. 4, the sacrificial oxide layer 12 is stripped from the substrate 11 using conventional chemical etching techniques which include exposing structure 10 to hydrofluoric acid. The oxide layer is stripped off because the implanting and annealing steps cause enough damage to render the oxide unusable as a gate oxide for a CMOS device. After removing the oxide layer, structure 10 is left including a high concentration of nitrogen atoms 22 at the surface.

Figure 5:
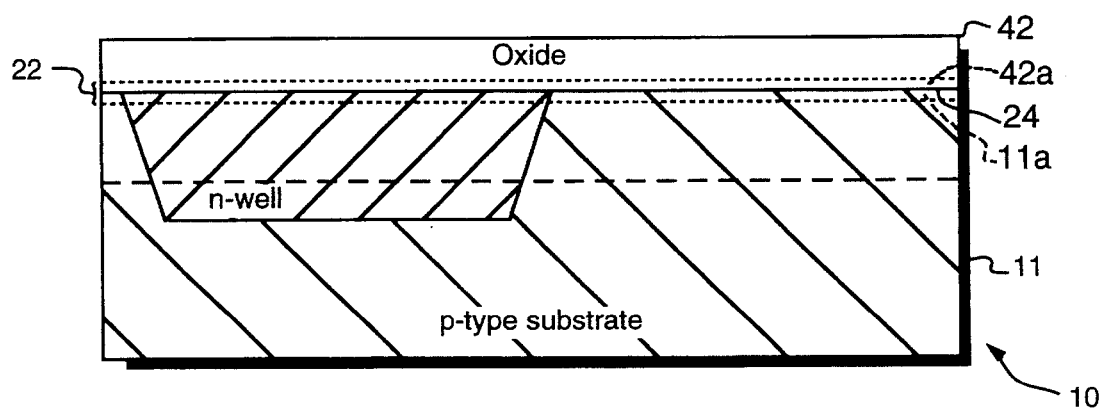

Referring now to FIG. 5 the structure 10 is shown to include a gate oxide layer 42 disposed over the silicon substrate 11. Oxide layer 42 further comprises an oxide surface layer portion 42a and substrate 11 further comprises a silicon substrate surface layer portion 11a. Here, the oxide layer 42 is thermally grown by placing structure 10 (FIG. 4) in a growth chamber having a dry $O_2$ ambient. The resultant oxide layer is principally composed of $SiO_2$. During the oxide growth process, nitrogen atoms migrate to the oxide layer as well as pile up at the interface 24 resulting in a CMOS device which has the region 22 of a very high concentration of nitrogen atoms about or around the substrate/oxide interface 24. The concentration of nitrogen at the new substrate/oxide interface is typically in a range of $1 \times 10^{11}/cm^2$ to $1 \times 10^{12}/cm^2$ with a preferred value being approximately $7 \times 10^{11}/cm^2$. The region 20 of nitrogen atoms typically extends 1000 angstroms into the substrate 11 and to a depth in the oxide which is typically ten to twenty percent of the oxide thickness. The remainder of the oxide will have a concentration of nitrogen atoms which is typically much less than $8 \times 10^{10}/cm^2$.

Figure 6:
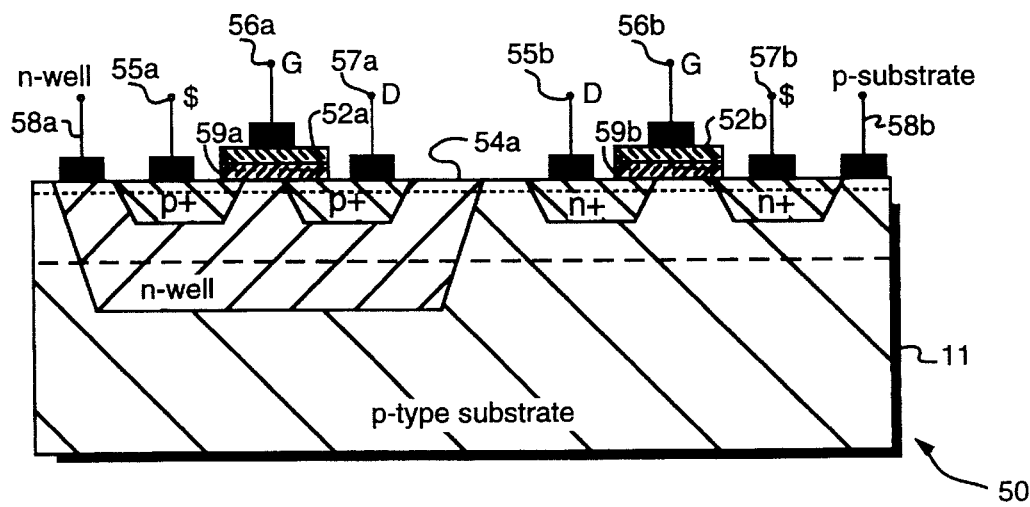

Referring now to FIG. 6, a CMOS device 50 is shown having undergone the remaining process steps following the formation of the gate oxide. In particular, the CMOS device includes a NMOS transistor having source, drain, and gate electrodes 55b, 57b, and 56b respectively as well as a connection 58b to the p-type substrate which is typically connected to a reference potential. Additionally, CMOS device 50 includes a PMOS transistor having source, drain, and gate electrodes 55a, 57a, and 56a respectively as well as a connection 58a to the p-type substrate which is typically connected to ground.

The finished CMOS device 50 includes an PMOS transistor and NMOS transistor having gate oxides 52a and 52b respectively, each having a region of high concentration of nitrogen atoms extending into the oxide a distance which is typically ten percent of the oxide thickness. There is also a high concentration of nitrogen atoms extending into the silicon substrate 11 to a depth of approximately 1000 angstroms. Notably absent from the oxides 52a and 52b and the substrate 11 is the presence of hydrogen atoms which are a detrimental byproduct of prior art techniques of introducing high concentrations nitrogen into the gate oxide of a MOS device. Also absent is an insulating layer of a silicon nitride material ($Si_3N_4$) which is another negative byproduct of different prior art techniques employed to achieve high nitrogen concentrations in the gate oxide of a MOS device.

A high concentration of nitrogen atoms in the gate oxide greatly reduces the "hot-carrier" effect by preventing charge build-up in the oxide layer. Therefore the size of the CMOS devices can be reduced while maintaining the higher operating voltages associated with larger CMOS devices without any adverse affect on the performance of the smaller CMOS device.

An alternate process of providing a high concentration of nitrogen atoms about the substrate/oxide interface makes use of fewer process steps than the preferred embodiment described above. However the ultimate nitrogen concentrations achieved are somewhat less than those achieved by following the steps provided for the preferred embodiment.

The alternate process starts in the same manner as shown in FIG. 1. A structure 10 is provided which includes silicon substrate 11 which is p-type substrate and is shown to include a n-type well 16 diffused therein. An oxide layer 12 here is thermally grown on a surface of the underlying silicon substrate 11. The oxide layer 12 is grown in a conventional manner in an oxygen ambient providing a layer of silicon dioxide ($SiO_2$). The difference between the structure provided here and the structure provided via the process of the preferred embodiment is that the oxide layer grown onto the underlying substrate 11 will be the final gate oxide.

Similar to the preferred embodiment and as shown in FIG. 2, the structure 10 will undergo a nitrogen implantation procedure. However, to avoid damage to the oxide layer, the implantation parameters include an $N_2$ concentration of $1-9\times10^{14}/cm^2$ at an energy in the range of 5–15 keV. The resultant structure 10 again has a region 20 wherein nitrogen atoms have been introduced.

After the implantation procedure, the structure 10 is subjected to the remaining process required to fabricate a CMOS transistor. The resulting device is similar to that shown FIG. 6. However the concentration of nitrogen atoms about the substrate/oxide interface is in the range of $1-5\times10^{11}/cm^2$. Apart from the lower concentration level of nitrogen, the alternate procedure provides the same advantages over the prior art as does the preferred embodiment. That is, a high concentration of nitrogen atoms is provided about the oxide/substrate interface. This high concentration of nitrogen atoms is incorporated without damaging the oxide layer, without the incorporation of hydrogen atoms, and without forming any insulating layers. Thus, the "hot-carrier" is greatly reduced by preventing charge build-up in the oxide layer, and therefore the size of the CMOS devices can be reduced while maintaining the higher operating voltages associated with larger CMOS devices without any adverse affect on the performance of the smaller CMOS device.

Having described a preferred embodiment of the invention, it will now become apparent, to one of skill in the art that other embodiments incorporating its concepts may be used. It is felt therefore, that this embodiment should not be limited to the disclosed embodiment, but rather should be limited only by the spirit and scope of the appended claims.

What is claimed is:

1. An article comprising:

a silicon substrate having a surface layer portion including nitrogen atoms;

an oxide layer disposed on the surface layer portion of said silicon substrate and consisting essentially of silicon dioxide and nitrogen atoms and being substantially free of a formation of $Si_3N_4$, with said silicon substrate surface layer portion and said oxide layer in a region having a concentration of nitrogen atoms in a range of at least $5\times10^{11}/cm^2$ to $1\times10^{12}/cm^2$ and occurring about an interface between said silicon substrate surface layer portion and said oxide layer, said region extending substantially from a depth of 1000 angstroms in said silicon substrate to a level in said oxide layer which is ten to twenty percent of the thickness of said oxide layer.

2. The article of claim 1 wherein said concentration of nitrogen atoms is approximately $7\times10^{11}/cm^2$.

3. The article of claim 1 wherein a remaining thickness of said oxide layer is substantially free of nitrogen atoms.

4. A complementary metal-oxide semiconductor comprising:

a silicon substrate, said silicon substrate having a plurality of doped regions disposed therein;

a first oxide layer disposed on a surface of said silicon substrate between a first source and drain pair disposed within said silicon substrate and consisting essentially of silicon dioxide and nitrogen atoms diffused throughout and being substantially free of a formation of $Si_3N_4$, said silicon substrate and said first oxide layer having the highest concentration of nitrogen atoms being in a range of at least $5\times10^{11}/cm^2$ to $1\times10^{12}/cm^2$ and occurring in a region encompassing an interface between said silicon substrate and said first oxide layer, said region extending substantially from a depth of 1000 angstroms in said silicon substrate to a level in said first oxide layer which is approximately ten to twenty percent of the thickness of said first oxide layer;

a second oxide layer disposed on a surface of said silicon substrate in a region spanning the separation between a second source and drain pair disposed within said silicon substrate and consisting essentially of silicon dioxide and nitrogen atoms diffused throughout and being substantially free of a formation of $Si_3N_4$, said second source and drain pair being further disposed within a well disposed within said silicon substrate and having doped characteristics opposite to said second source and drain pair, said silicon substrate and said second oxide layer having the highest concentration of nitrogen atoms being in a range of approximately $1\times10^{11}/cm^2$ to $1\times10^{12}/cm^2$ and occurring in a second region encompassing an interface between said silicon substrate and said second oxide layer, said region extending substantially from a depth of 1000 angstroms in said silicon substrate to a level in said second oxide layer which is approximately ten to twenty percent of the thickness of said second oxide layer.

5. The complementary metal-oxide semiconductor of claim 4 wherein said concentration of nitrogen atoms is approximately $7\times10^{11}/cm^2$.

6. The complementary metal-oxide semiconductor of claim 4 wherein said silicon substrate is a p-type silicon substrate and wherein said first source and drain pair are n-type regions and wherein said second source and drain pair are p-type regions and wherein said well is an n-type well.

7. The complementary metal-oxide semiconductor of claim 4 wherein said silicon substrate is a n-type silicon substrate and wherein said first source and drain pair are p-type regions and wherein said second source and drain pair are n-type regions and wherein said well is a p-type well.

8. The complementary metal-oxide semiconductor of claim 4 wherein a remaining thickness of each of said first and second oxide layers is substantially free of nitrogen atoms.

* * * * *